(12) United States Patent
Cheng et al.

(10) Patent No.: US 8,384,837 B2
(45) Date of Patent: Feb. 26, 2013

(54) ARRAY SUBSTRATE OF LIQUID CRYSTAL DISPLAY DEVICE AND REPAIR METHOD THEREOF

(75) Inventors: I-Ming Cheng, Guangdong (CN); De Bian, Guangdong (CN)

(73) Assignee: Century Display(ShenZhen)Co., Ltd., Loghua, Baoan, Shen-zhen, Guangdong (CN)

( * ) Notice: Subject to any disclaimer, the term of this patent is extended or adjusted under 35 U.S.C. 154(b) by 413 days.

(21) Appl. No.: 12/818,178

(22) Filed: Jun. 18, 2010

(65) Prior Publication Data

US 2011/0194041 A1    Aug. 11, 2011

(30) Foreign Application Priority Data

Feb. 10, 2010   (CN) .......................... 2010 1 0119181

(51) Int. Cl.
*G02F 1/136259*    (2006.01)

(52) U.S. Cl. ......................................... 349/54; 349/192
(58) Field of Classification Search ................... None
See application file for complete search history.

(56) References Cited

U.S. PATENT DOCUMENTS

| 7,417,692 | B2 * | 8/2008 | Lin ................................. 349/38 |
| 7,777,824 | B2 * | 8/2010 | Jeong et al. ..................... 349/54 |

* cited by examiner

*Primary Examiner* — Thanh-Nhan P Nguyen
(74) *Attorney, Agent, or Firm* — Winston Hsu; Scott Margo

(57) ABSTRACT

A repair method for an array substrate of a liquid crystal display device includes, providing an array substrate for a liquid crystal display device, detecting a line defect of a signal transmitting wire and locating the line defect, performing a removal process to remove a shielding layer covering two ends of the line defect and the shielding layer extending to a common line adjacent to the line defect, performing a deposition process to deposit a connecting metal layer the region where the shielding layer is removed, and performing a cutting process to cut outer ends of the common line adjacent to the line defect to form a common line section. The signal transmitting wire forms an electrical circuit with the common line section.

14 Claims, 16 Drawing Sheets

ARRAY SUBSTRATE OF LIQUID CRYSTAL DISPLAY DEVICE AND REPAIR METHOD THEREOF

BACKGROUND OF THE INVENTION

1. Field of the Invention

The present invention relates to an array substrate of a liquid crystal display and a repair method thereof, and more particular, to an array substrate of the liquid crystal display device and a repair method thereof that repairs line defects.

2. Description of the Prior Art

Nowadays, because of many advantages, such as high display quality, good space utilization, low power consumption, and low radiation, the liquid crystal display device has become more and more popular. As the liquid crystal display technology advances, the liquid crystal display device has been widely employed in many fields. Generally, the liquid crystal display device includes an array substrate, a counter substrate and a liquid crystal layer sandwiched between the two substrates. The array substrate mainly includes a substrate, pixel structures arranged on the substrate in an array, a plurality of scan lines and a plurality of data lines. Each of the above mentioned pixel structures mainly includes a thin film transistor (TFT), a pixel electrode and a common line. Through generating an electric field between the two substrates, the liquid crystal layer sandwiched between the two substrates is driven by an electric field, and the rotation angle of the liquid crystal is altered to implement brightness control of the display panel.

It is to be noted that, in actual manufacturing, line defects often occur in the array substrate due to process unsteadiness or other factors, the line defects often refer to the defects of the scan lines or the defects of the data lines on the substrate. In order to improve the yield of the liquid crystal display device as well as to reduce the manufacturing cost, the line defects must be repaired. When the line defects reduce the quality of the display, the low quality substrates of the display are scrapped. Therefore, a repair method must be provided to improve the display quality, and to minimize the scrap rate of the substrates. The passages below describe the repairing of data lines with defects and scan lines with defects by conventional methods.

FIG. 1 is a schematic diagram illustrating a repair of a data line in accordance with a conventional laser repair method. As illustrated in FIG. 1, a scan line 11 and a data line 12 are perpendicularly intersected with one another to define a pixel region, wherein the data line 12 includes a plurality of protrusions 21. A pixel electrode 13, which is made of indium tin oxide (ITO), is disposed in the pixel region, and the pixel electrode 13 is electrically connected to the scan line 11 and the data line 12 respectively through a thin film transistor 14. A shielding wire 20 is disposed between the pixel electrode 13 and the data line 12, and the shielding wire 20 is disposed parallel to the data line 12 and overlapping the protrusions 21 of the data line 12. When a line defect occurs at the data line 12, a laser repair method is performed to connect the protrusion 21 to the shielding wire 20, so that the data signals can bypass the broken data line 12, and continue the transmission via the shielding wire 20, improving the yield of the panel. Although the method above can repair the line defects, the laser repair method requires additional structure designs (e.g. the designs of the protrusions 21), which greatly increases the complexity of the pixel structure as well as the difficulty of the process of manufacturing. Furthermore, other defects may be introduced during the method described above, e.g. contamination of the pixel electrode during the formation of the protrusions could occur, affecting the quality of the display of the panel.

FIG. 2 is a schematic diagram illustrating a repair of a data line in accordance with another conventional laser repair method. As illustrated in FIG. 2, a scan line 11 and a data line 12 are perpendicularly intersected with each other to define a pixel region. A pixel electrode 13, which is made of ITO, is disposed in the pixel region, and the pixel electrode 13 is electrically connected to the scan line 11 and the data line 12 respectively via a thin film transistor 14. A common line 15 is disposed in the peripheral region of the pixel electrode 13, and the common line 15 is disposed parallel to the scan line 11 or the data line 12, wherein a portion of the common line 15 disposed parallel to the data line 12 includes a opening part 51. The opening part 51 divides the common line 15 into two sections, and an extension part 16 of the common line 15 partially overlaps the data line 12. When a line defect occurs at the data line 12, the overlapping region between the extension part 16 and the data line 12 are connected by a laser repair method, so that the data signals can bypass the broken data line 12 and complete the transmission via the common line 15, improving the yield of the panel. Although such method is less complicated, the extension part 16 would generate a parasitic capacitance, which adversely affects the display quality.

FIG. 3A is a schematic diagram illustrating a repair of a scan line in accordance with another conventional laser repair method. As illustrated in FIG. 3A, a scan line 11 and a data line 12 are perpendicularly intersected to define a pixel region. A pixel electrode 13, which is made of ITO, is disposed in the pixel region, and the pixel electrode 13 is electrically connected to the scan line 11 and the data line 12 respectively via a thin film transistor 14. When a line defect A occurs at the scan line 11 between two adjacent data lines 12, the repair method includes: first, dividing the pixel electrode 13 above the line defect A into a display portion 13a and a repair portion 13b surrounded by the display portion 13a so that the display portion 13a and the repair portion 13b are electrically insulated from each other; and then electrically connecting the repair portion 13b and the two ends of the broken scan line 11 with the line defect A via a laser repair method. Although such method can repair the scan line with the line defect, the aperture ratio of the display region is reduced, and therefore the display quality is adversely affected. Furthermore, since there are two layers existing between the pixel electrode and the scan line, the level of difficulties when connecting the pixel electrode with the scan line is increased. Consequently, the success rate of the repair is reduced.

FIG. 3B is a schematic diagram illustrating a repair of a scan line in accordance with another conventional laser repair method. As illustrated in FIG. 3B, a scan line 11 and a data line 12 are perpendicularly intersected to define a pixel region. A pixel electrode 13, which is made of ITO, is disposed in the pixel region, and the pixel electrode 13 is electrically connected to the scan line 11 and the data line 12 respectively via a thin film transistor 14. When a line defect occurs at the scan line 11 below the data line 12, the repair method includes: first, dividing the pixel electrodes 13 adjacent to the line defect into a display portion 13b and a repair portion 13a, which are electrically insulated with each other; and then depositing a metal film 41 on the repair portions 13a between the two adjacent pixel electrodes 13 so that two ends of the broken scan line 11 are electrically connected via the metal film 41. Although such method can repair the line defects, the procedures of the repair are more complicated.

Also, when depositing the metal film 41, the deposition could be very time consuming and the results of the deposition cannot be guaranteed. Furthermore, the pixel electrode may be contaminated during the deposition process, which adversely affects the display quality.

In summary, the repair method in the prior art in repairing the line defects at data lines cannot achieve a good repair result. If the repair method is employed, the complexity of the pixel structure would increase, the corresponding manufacturing process would be more difficult, and the pixel electrode could be contaminated. Therefore, a simple repair method that is not limited by the position of defects is desired, and thus the present invention provides a rather simple and effective laser repair method.

SUMMARY OF THE INVENTION

It is therefore one of the objectives of the present invention to provide an array substrate of a liquid crystal display panel and a repair method thereof, which particularly repairs the line defects of the signal transmitting wires to avoid scrapping the array substrate of the liquid crystal display device.

It is another objective of the present invention to provide a simple repair method for the line defects of the signal transmitting wire line of an array substrate of a liquid crystal display device, to easily and effectively repair the line defects of the signal transmitting wire while avoiding other defects occurring during the repairing and maintaining a high aperture ratio. In addition, the design of the present invention does not introduce additional manufacturing processes which therefore not only repairs the line defects of the signal transmitting wire, but also raises the production yield.

For the above mentioned objective, the present invention provides a repair method for an array substrate of a liquid crystal display device, including the following steps: step 1: providing an array substrate; step 2: detecting a line defect of a signal transmitting wire and locating the line defect; step 3: performing a removal process to remove shielding layers which cover two ends of the line defect and extend to a common line adjacent to the line defect so that two ends of the signal transmitting wire having the line defect are exposed; step 4: performing a deposition process to deposit a connecting metal layer on regions where the shielding layers are removed by a laser chemical vapor deposition process, wherein the connecting metal layer electrically connects two ends of the exposed signal transmitting wire; step 5: performing a cutting process to cut outer ends of the common line adjacent to the line defect to form a common line section, wherein the signal transmitting wire forms an electrical circuit with the common line section.

The present invention provides an array substrate of a liquid crystal display device repaired by the aforementioned repair method. The array substrate includes a substrate; a plurality of signal transmitting wires intersected perpendicularly to form a plurality of pixel units, wherein the signal transmitting wires include at least a line defect; a plurality of thin film transistors disposed in the pixel units and driven by the signal transmitting wires; a plurality of common lines disposed on the array substrate; at least one common line section, wherein the common line section is parallel to the signal transmitting wires, and the common line section is electrically connected to one of the signal transmitting wires; a connecting metal layer disposed on two ends of the line defect and electrically connected to one of the signal transmitting wires and the common line section; and a plurality of pixel electrodes disposed in the pixel units one-to-one and electrically connected to the thin film transistors respectively, wherein a portion of each of the pixel electrode is coupled with the corresponding common line to form a storage capacitor.

In accordance with an embodiment of the present invention, the signal transmitting wires on the array substrate of the liquid crystal display device include scan lines and data lines intersected perpendicularly to form pixel units.

In accordance with an embodiment of the present invention, when a line defect occurs at the data line, first the precise position of the line defect on the data line is detected; then a laser light beam is used to remove the shielding layer covering the data line and the common line adjacent to the line defect, so the ends of the data line and the common line adjacent to the line defect are exposed; then a laser chemical vapor deposition process is performed to deposit the connecting metal layer on the exposed region, wherein the connecting metal layer is electrically connected to the data line and the common line; finally, external ends of the common line are cut by the laser light beam so that the scan line forms an electrical circuit with the common line section.

In accordance with an embodiment of the present invention, when a line defect occurs at both the data line and the scan line, the repair method includes the following steps. First, the precise position of the line defect on the scan line and the data line is detected; then a laser light beam is used to remove the shielding layer covering the data line, the scan line and the common line adjacent to the line defect, so that the ends of the signal transmitting lines adjacent to the line defect are exposed; then a laser chemical vapor deposition process is performed to deposit the connecting metal layer on the exposed region, wherein the connecting metal layer is electrically connected to the scan line and the common line; finally, the external end of the common line is cut by the laser light beam so that the data line and the scan line form an electrical circuit with the common line section.

In accordance with an embodiment of the present invention, the shielding layer is a shielding layer for metal, and the shielding layer for metal and a passivation layer are removed by the same removal process; in accordance with another embodiment of the present invention, the shielding layer includes a shielding layer for metal, a passivation layer and a pixel electrode layer.

In accordance with an embodiment of the present invention, the removal process is executed by one of far-infrared light, far-ultraviolet light, green light and laser light beam.

In accordance with an embodiment of the present invention, the common line forms a "C" shape, an "H" shape, or hollow square shape on the array substrate, and the common line section is formed by cutting the common line.

In accordance with an embodiment of the present invention, the common line and the scan line are formed by the same layer.

In accordance with an embodiment of the present invention, the connecting metal layer deposited by the laser chemical vapor deposition process includes a tungsten layer.

In accordance with an embodiment of the present invention, a target material used for the laser chemical vapor deposition process includes a tungsten-carbon compound.

In accordance with an embodiment of the present invention, a thickness of the connecting metal layer deposited by the laser chemical vapor deposition process is substantially between 2000 angstroms (Å) and 4000 Å.

These and other objectives of the present invention will no doubt become obvious to those of ordinary skill in the art after reading the following detailed description of the preferred embodiment that is illustrated in the various figures and drawings.

DETAILED DESCRIPTION

The methods and structures described in the following embodiments, not only repair the line defect of the data line or the scan line, but also design the signal transmitting wires to ensure the aperture ratio of the pixel.

Figure 1:
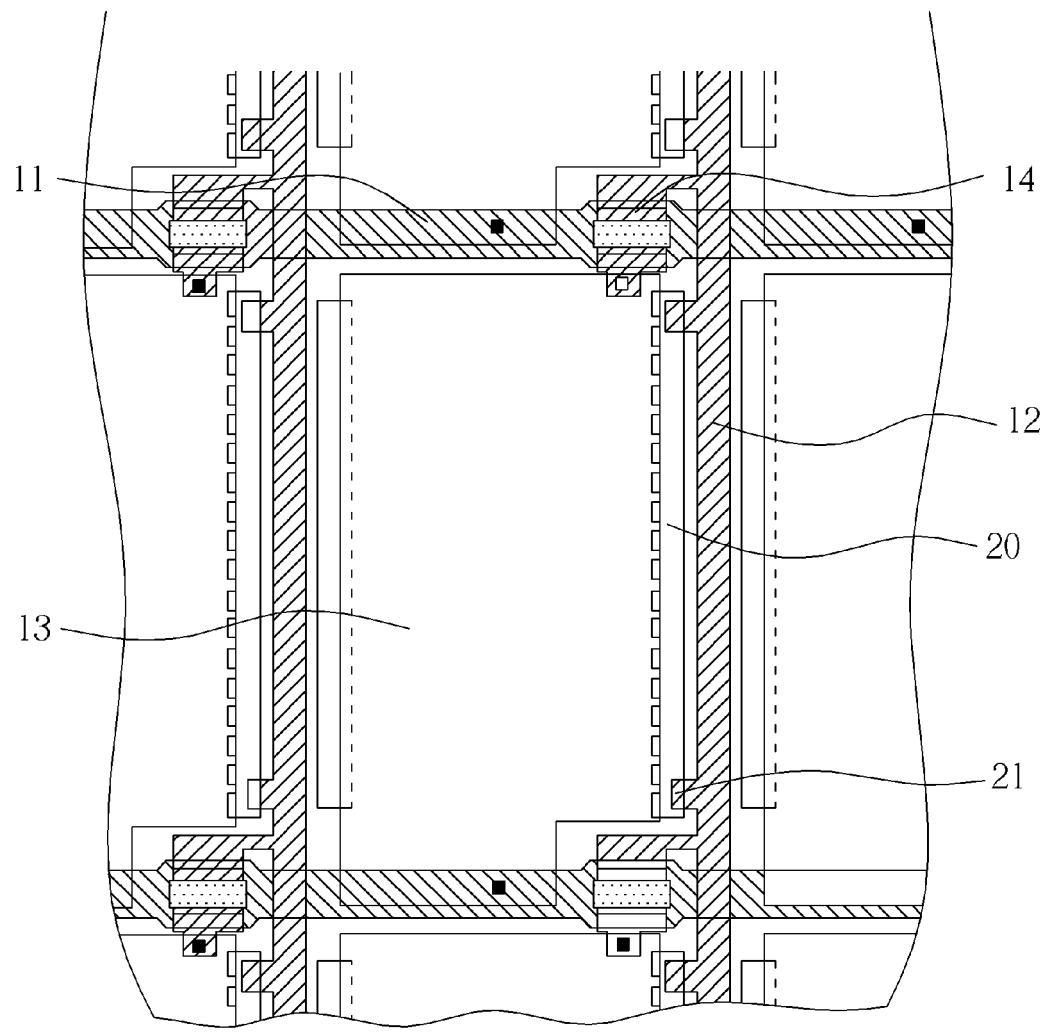
FIG. 1 is a schematic diagram illustrating a repair of a data line in accordance with a conventional laser repair method.
Figure 2:
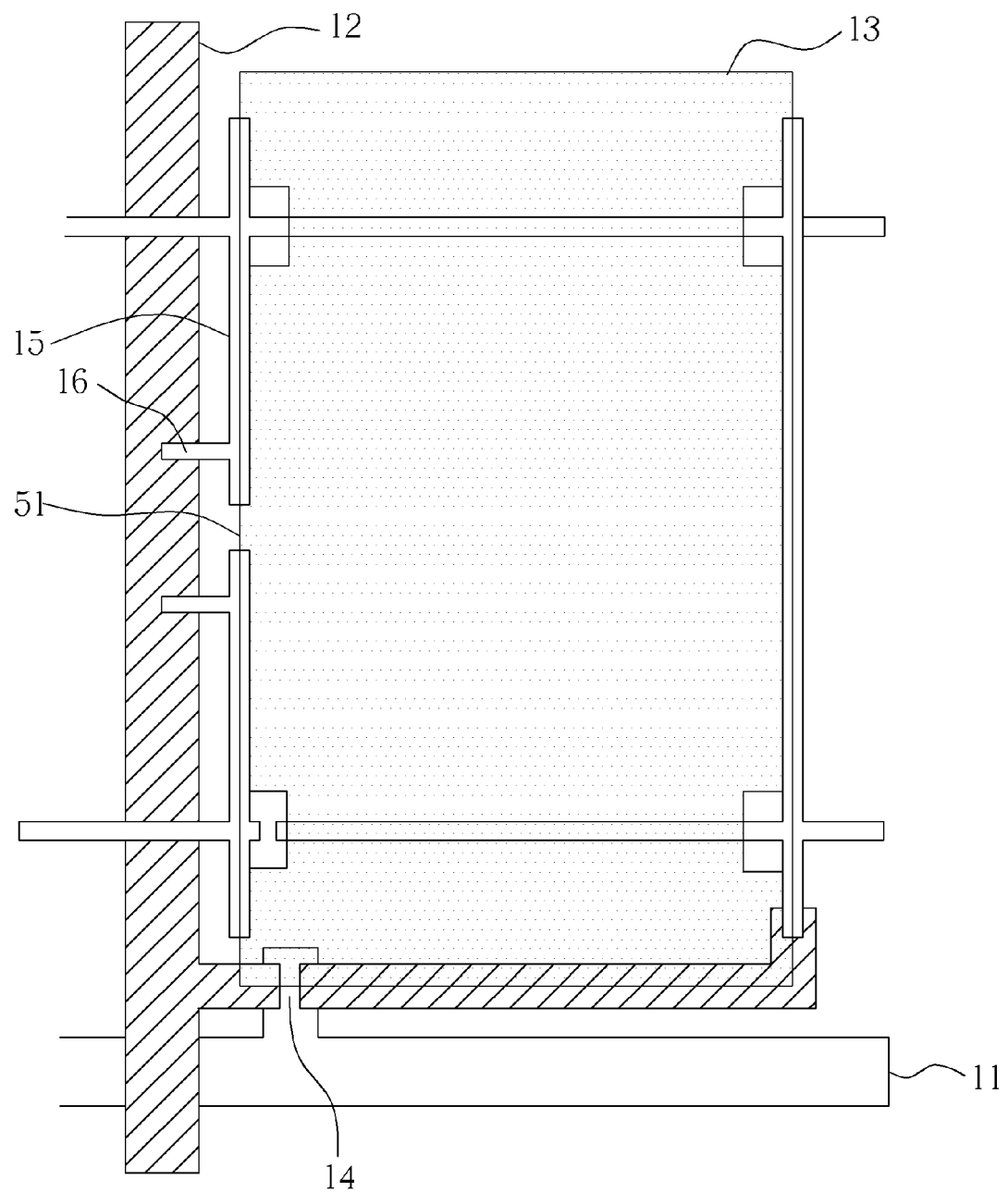
FIG. 2 is a schematic diagram illustrating a repair of a data line in accordance with another conventional laser repair method.
Figure 3A:
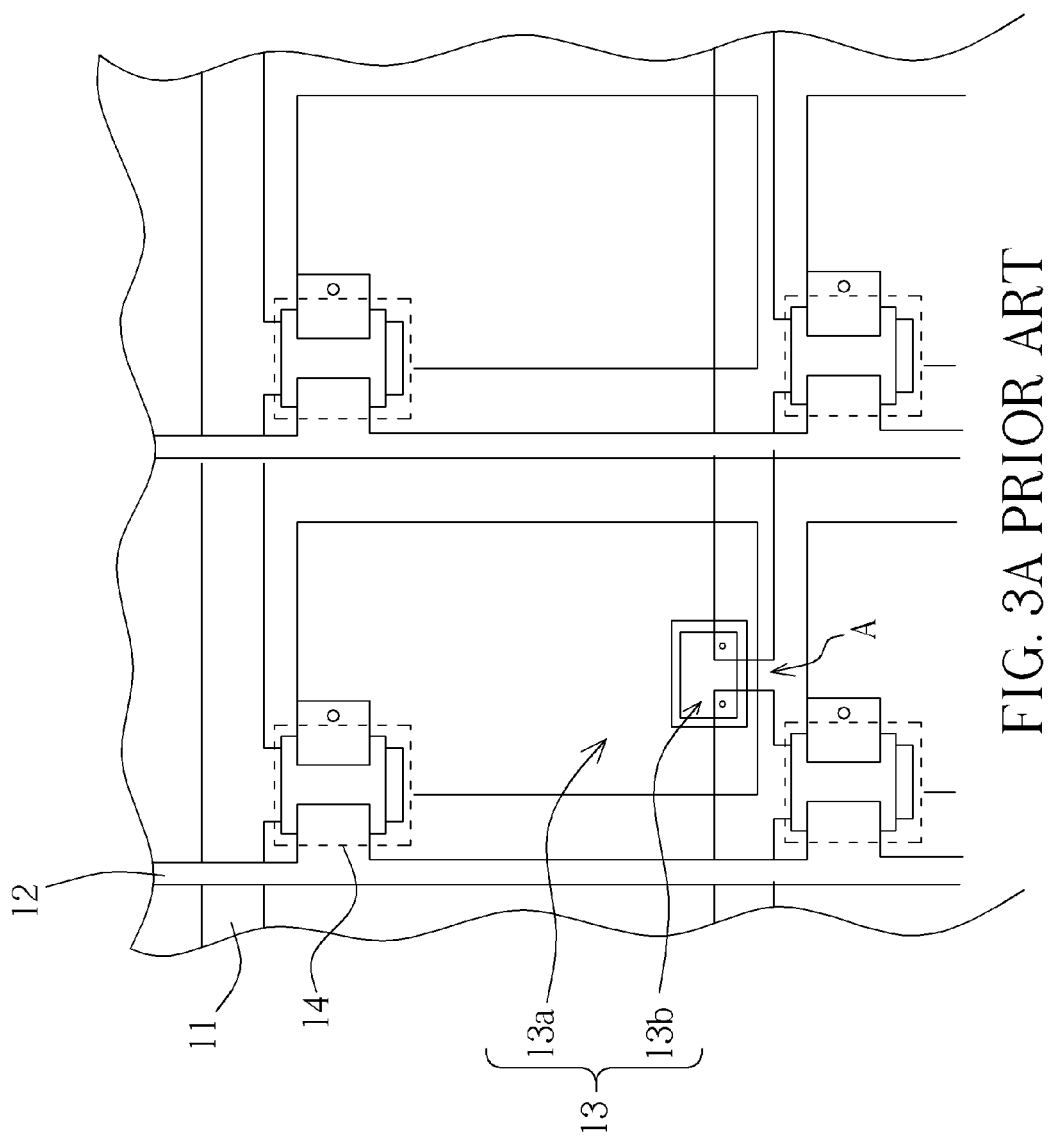
FIG. 3A is a schematic diagram illustrating a repair of a scan line in accordance with another conventional laser repair method.
Figure 3B:
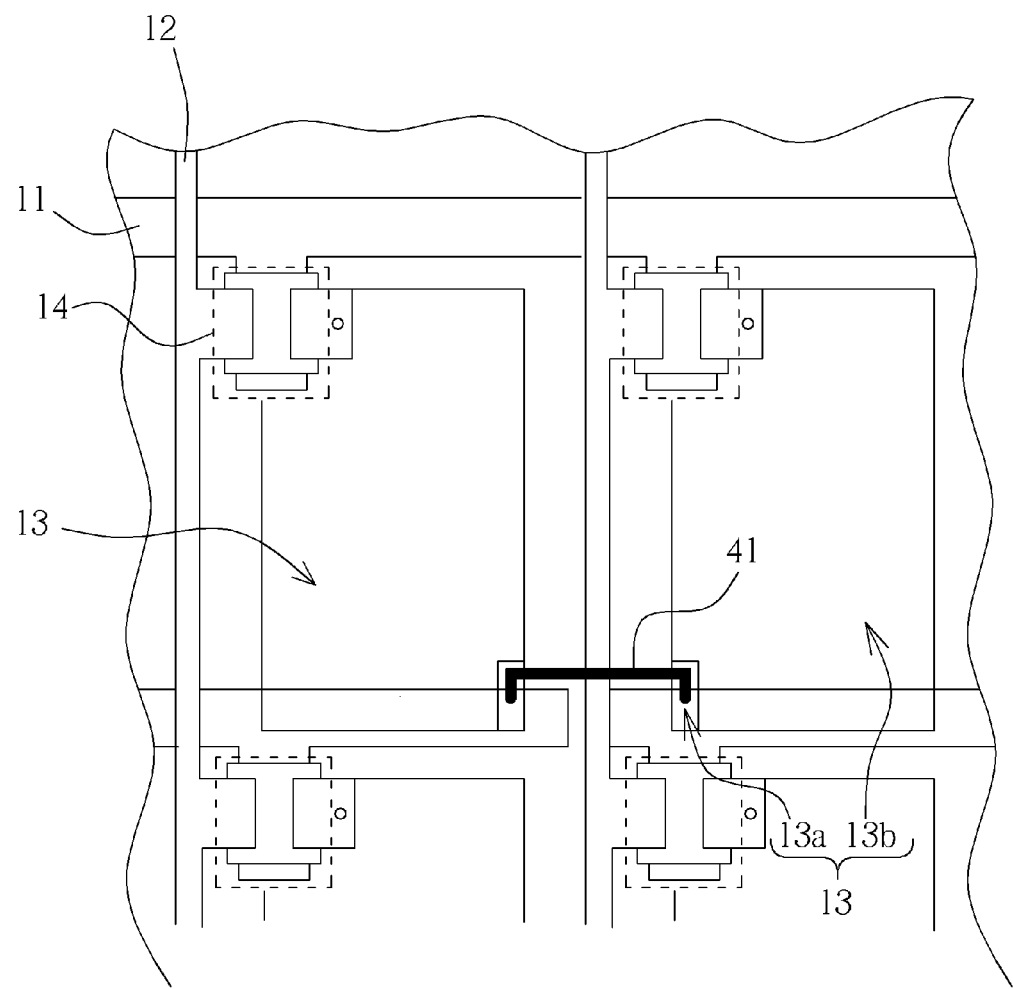
FIG. 3B is a schematic diagram illustrating a repair of a scan line in accordance with another conventional laser repair method.
Figure 4:
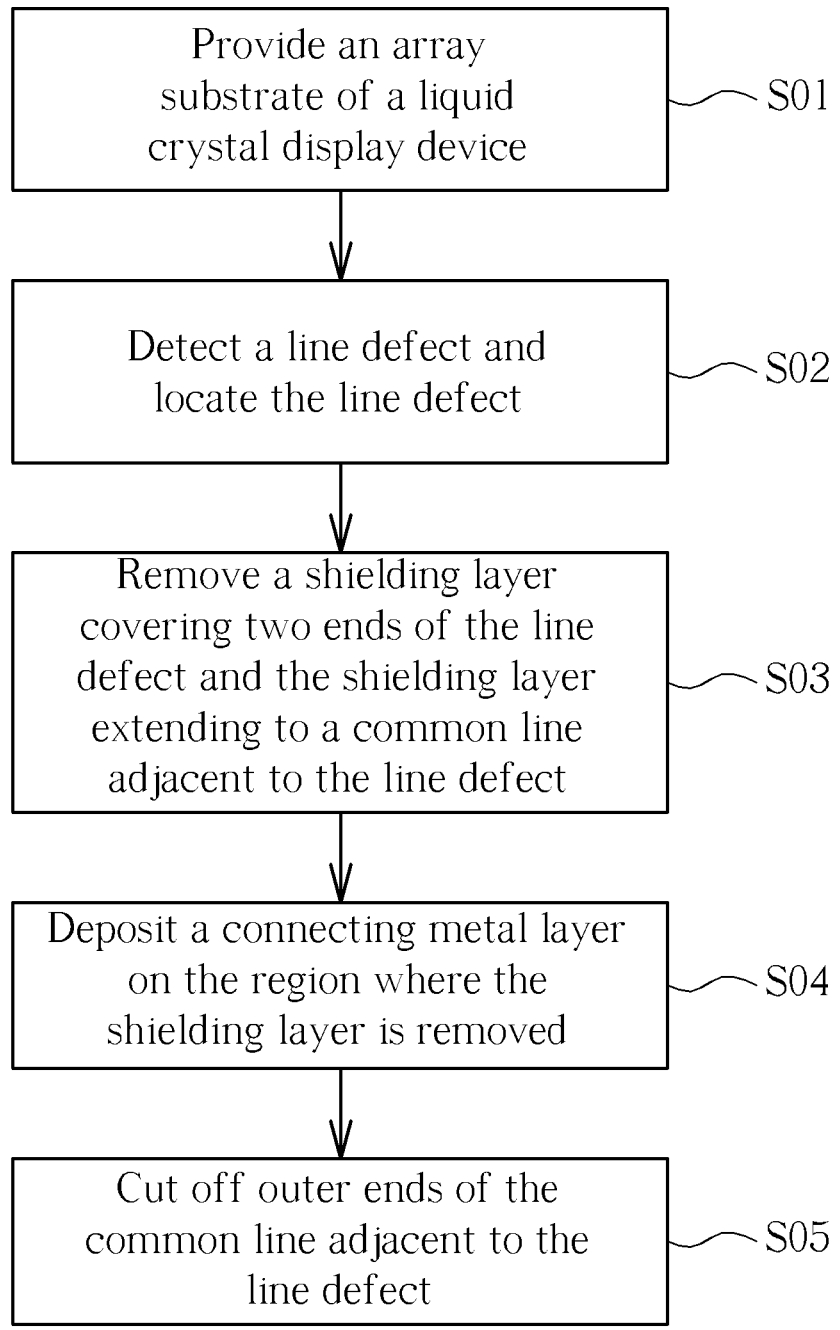
FIG. 4 is a schematic line defect repair process flow diagram in accordance with the present invention.

FIG. 4 is a schematic line defect repair process flow diagram in accordance with the present invention. As illustrated in FIG. 4, the repair process includes the following steps. First, provide an array substrate of a liquid crystal display device (S01); then, detect a line defect and locate the line defect (S02). The detections may be executed by AOI machine or other methods/machines, e.g. a TESTER machine could detect, for detecting any line defect of the signal transmitting wires. The signal transmitting wires described above include a data line and a scan line. Then, locate the positions of the line defects at the data line or the scan line and remove a shielding layer covering two ends of the line defect and the shielding layer extending to a common line adjacent to the line defect (S03). The shielding layer located on the two ends of the signal transmitting wire adjacent to the line defect, and the shielding layer extending horizontally from the two ends to the space (line section) of the common line is removed by a laser light beam.

When the shielding layer described above includes only a shielding layer for metal (i.e. the third process without the deposition of the transparent electrode layer of the five processes in fabricating a TFT-LCD, and the line defect is detected and repaired), the shielding layer for metal is disposed above a first metal layer. The first metal layer includes scan lines and common lines. Meanwhile, the shielding layer described above may be removed using an IR (far-infrared light), a UV (far-ultraviolet light), a green light (Green), or a laser light beam. Typically, the wavelength of the IR is between 1000 nm and 1500 nm, and the wavelength of the green light is between 450 nm and 600 nm. Through adjusting the energy of the light breams, the objective of removing the shielding layer can be achieved. When the shielding layer mentioned above includes an insulation layer and a transparent electrode layer, e.g. materials such as Indium Tin Oxide (ITO), the transparent electrode layer, used to form the pixel electrode, forms a storage capacitor with the common line below the pixel electrode. Also, the energy beams such as the IR with the wavelength between 1000 nm and 1500 nm or the green light with the wavelength between 450 nm and 600 nm, may be adjusted to remove the shielding layer mentioned above.

Then a connecting metal layer is deposited on the regions where the shielding layer is removed (S04). A laser chemical vapor deposition (L-CVD) repairing apparatus is used using a tungsten-carbon compound as its target material to deposit the connecting metal layer on the regions where the data line and the common line are exposed in order to repair the line defect of the data line. Or, the connecting metal layer may also be formed on regions where the scan line and the common line are exposed in order to repair the line defect of the scan line. Typically, the thickness of the connecting metal layer is between 2000 Å and 4000 Å, wherein the exposed regions of the scan line or the data line and the common line are the regions where the shielding layer is removed. When the shielding layer includes only the shielding layer for metal, the connecting metal layer would be slightly larger than the exposed regions of the data line and the common line, so that the electrical connection can be further improved. When the shielding layer includes the insulation layer and the transparent electrode layer, two different methods can be employed. In method 1, the connecting metal layer is slightly smaller than the regions where the data line and common line is exposed, so that the transparent electrode layer is not electrically connected to the connecting metal layer. In method 2, in order to improve the electrical connection of the connecting metal layer, the connecting metal layer is slightly larger than the regions where the data line and the common line are exposed. The process of disconnecting the electrical connection between the connecting metal layer and the transparent electrode layer will be performed after all of the repair processes have completed. Method 2 will be discussed in more details in the following passages.

Then the repair process includes performing a cutting process to disconnect outer ends of the common line adjacent to the line defect to form a common line section (S05). The laser light beam is used to cut off the electrical connection of the common line adjacent to the outer ends of the connecting metal layer, so that the common line is by passed without being affected by the signal of the data line or the signal of the scan line. Also, the signal transmission of the data line or the scan line is completed via the common line section between the connecting metal layers. When the shielding layer mentioned above includes the insulation layer and the transparent electrode layer, method 2 is employed to form a thin channel in the pixel electrode around the common line after the common line disposed in the external ends of the shielding layer is cut off, so that the pixel electrode is not electrically connected to the common line between the connecting metal layers. Typically a width of the thin channel is between 2 micrometers (um) and 6 um.

Figure 5:
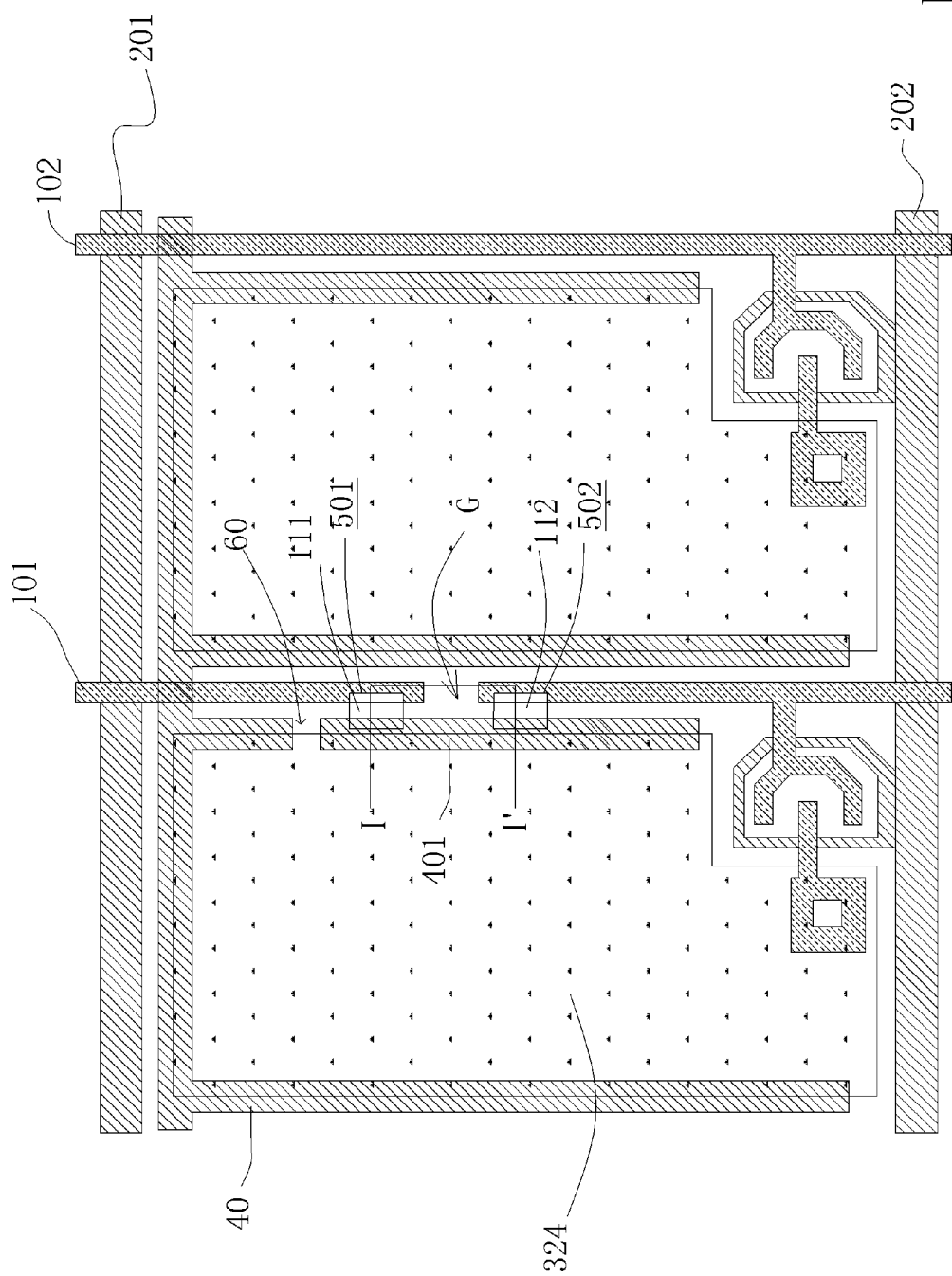
FIG. 5 is a schematic diagram illustrating a line defect in a "C" shaped common line in accordance with the present invention.

Referring to FIG. 5, FIG. 5 is a schematic diagram illustrating a line defect in a "C" shaped common line in accordance with the present invention. A first data line 101 is disposed perpendicular to a first scan line 201, the first data line 101 is disposed parallel to a second data line 102, the first scan line 201 is disposed parallel to a second scan line 202, the second scan line 202 is disposed perpendicular to the first data line 101, the second scan line 202 is disposed perpendicular to the second data line 102, and the second data line 102 is disposed perpendicular to the first scan line 201. The intersected data lines and the scan lines define a plurality of pixel units, wherein a common line 40 serving as a bottom electrode of a storage capacitor is disposed on top of the data lines and the scan lines, and the common line 40 forms the storage capacitor with the pixel electrode 324 in the pixel unit. The shape of the common line 40 in the pixel unit affects the magnitude of the storage capacitor directly. In the present embodiment, the common line 40 serving as the bottom electrode of the storage capacitor has a "C" shape, wherein a "C" shaped common line section 401 is the line section of the common line 40 after the cutting process and is not electrically connected to the original common line 40, i.e. the common line section 401 above the connecting metal layer 111 is cut off. The previously described cut off region is the opening 60, and the "C" shaped common line section 401 is partially coupled with the pixel electrode 324 and partially contacts the connecting metal layers 111 and 112. In addition, the connecting metal layers 111 and 112 are also partially connected to the first data line 101 having the line defect G. The connecting metal layers 111 and 112 are disposed adjacent to the two ends of the line defect G, but do not overlap the line defect G. Therefore, the repaired circuit described above allows the first data line 101 having the line defect G to complete the transmission via the common line section 401.

Figure 6A:
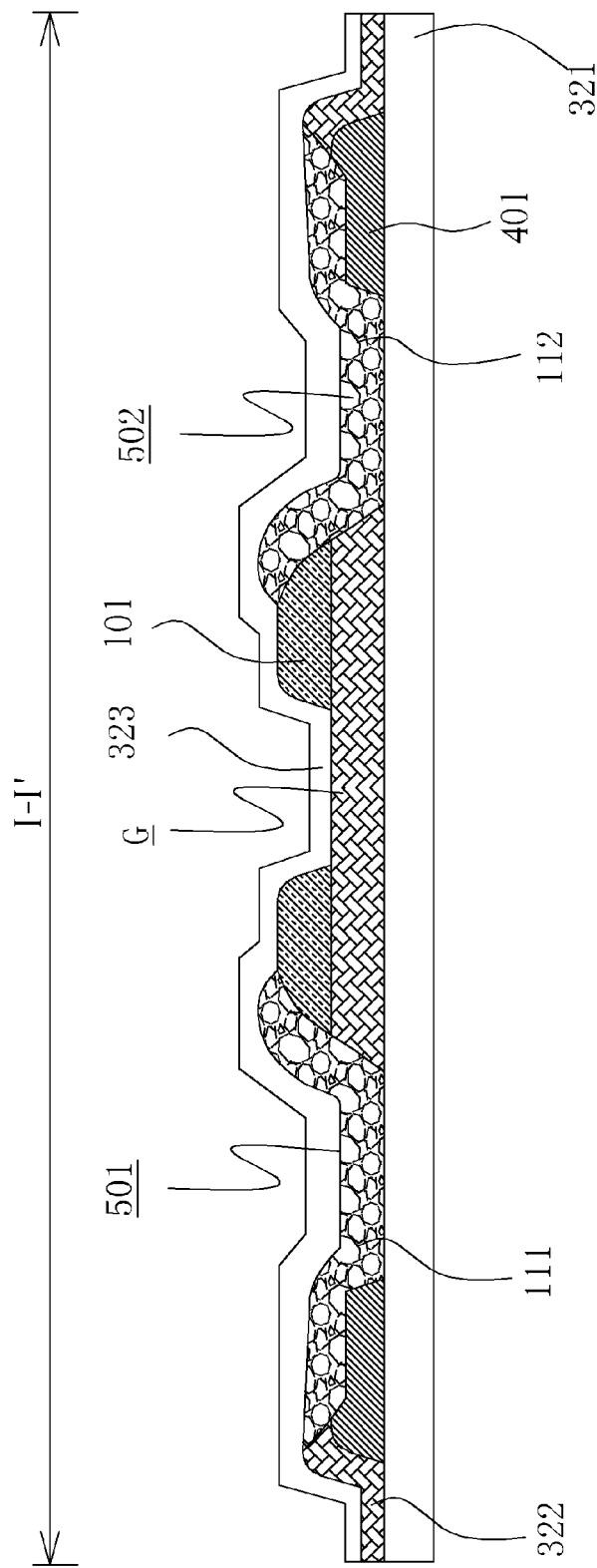
FIG. 6A and FIG. 6B are a schematic cross-sectional diagrams illustrating the line section across line I-I' of FIG. 5.

FIG. 6A is a schematic cross-sectional diagram illustrating the line section across line I-I' of FIG. 5. Referring to FIG. 5 and FIG. 6A, when the shielding layer includes only the shielding layer for metal (i.e. the third process without the deposition of the transparent electrode layer of the five processes in fabricating a TFT-LCD, and the line defect is detected and repaired), the common line section 401, the shielding layer for metal 322 and the connecting metal layers 111 and 112 are disposed on a glass substrate 321. A portion of the shielding layer for metal 322 previously described is disposed on a portion of the common line section 401, and the first data line section 401 is disposed on the other portion of the shielding layer for metal 322. During the third process without the deposition of a passivation layer 323 of the five processes in fabricating a TFT-LCD, the detection detects the line defects and proceeds to the repairing immediately. The IR with a wavelength between 1000 nm and 1500 nm or the green light with a wavelength between 450 nm and 600 nm removes the shielding layer for metal 322, and the regions of removal are positions of connection holes 501 and 502 as illustrated in the figure (the regions of removal also includes the shielding layer described above located adjacent to the two ends of the line defect, and the space (line sections) extending horizontally from these two ends to the common line section). Also, the positions of the connection holes 501 and 502 are covered by the connecting metal layers 111 and 112. Therefore, the laser chemical vapor deposition (L-CVD) repairing apparatus is used using a tungsten-carbon compound as its target material to deposit the connecting metal layer 111 and 112 on the regions where the first data line 101 and the common line section 401 are exposed, i.e. to deposit the connecting metal layers 111 and 112 on the connection holes 501 and 502 in order to repair the line defect G of the first data line 101. Typically, the connecting metal layers 111 and 112 are slightly larger than the exposed regions of the first data line 101 and the common line section 401, i.e. the connection holes 501 and 502, so that the connecting metal layers 111 and 112 cover a portion of the first data line 101 and a portion of the common line section 401. Then the laser light beam is used to disconnect the common line section 401 located above the connecting metal layer 111, so that the common line 40 is not affected by the signal of the first data line 101 having the line defect G, and the signal of the first data line 101 may also complete the transmission via the common line section 401 between the connecting metal layers 111 and 112 in order to complete the signal transmission. Then the following manufacturing process of the array substrate is continued to form the passivation layer 323 and the transparent electrode layer (not illustrated in the figure).

Figure 6B:
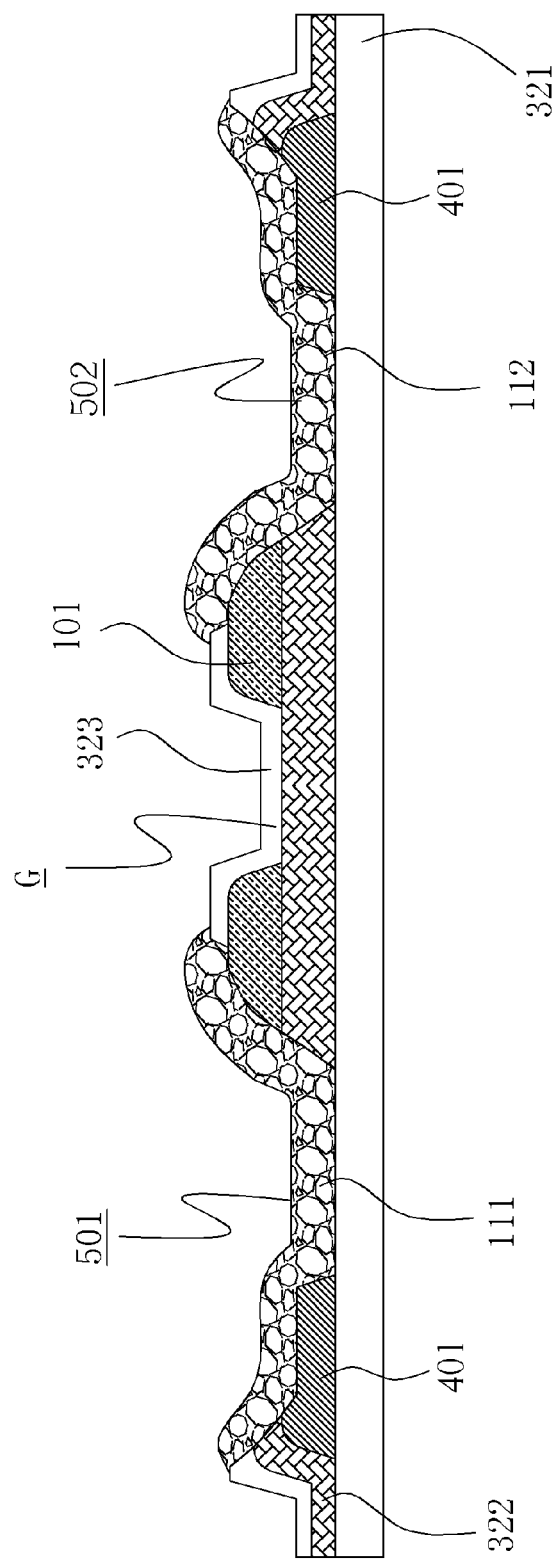

FIG. 6-B illustrates when the shielding layer includes the insulation layer and the transparent electrode layer (i.e. the five processes in fabricating a TFT-LCD are completed, and the line defect is detected and repaired). Referring to FIG. 5 and FIG. 6B, the common line section 401, the shielding layer for metal 322 and the connecting metal layers 111 and 112 are disposed on the glass substrate 321, and the passivation layer 323 is further disposed thereon. In addition, a portion of the shielding layer for metal 322 mentioned above is disposed on a portion of the common line section 401, the passivation layer 323 is further covered on the metal shielding layer 322, the first data line section 401 is disposed on another portion of the shielding layer for metal 322, and the passivation layer 323 is further partially covered on the first data line section 401. After completing the five processes of manufacturing the TFT, the line defect is detected and repaired. The IR with a wavelength between 1000 nm and 1500 nm or the green light with a wavelength between 450 nm and 600 nm removes the shielding layer for metal 322 and the passivation layer 323, and the regions of removal are positions of the connection holes 501 and 502 as illustrated in the figure (the regions of removal also includes the shielding layer described above located adjacent to the two ends of the line defect, and the space (line sections) extending horizontally from the two ends to the common line section). Also, the positions of the connection holes 501 and 502 are covered by the connecting metal layers 111 and 112. Thereafter, the laser chemical vapor deposition (L-CVD) repairing apparatus is used using a tungsten-carbon compound as its target material to deposit the connecting metal layer 111 and 112 on the regions where the first data line 101 and the common line section 401 are exposed, i.e. the connection holes 501 and 502, to repair the line defect G of the first data line 101. Typically, the connecting metal layers 111 and 112 are slightly larger than the exposed regions of the first data line 101 and the common line section 401, i.e. the connection holes 501 and 502, so that the connecting metal layers 111 and 112 cover a portion of the first data line 101 and a portion of the common line section 401. Then the laser light beam is used to disconnect the common line section 401 located above the connecting metal layer 111, so that the common line 40 is not affected by the signal of the first data line having the line defect G, and the signal of the first data line 101 may also complete the transmission via the common line section 401 between the connecting metal layers 111 and 112.

Figure 7:
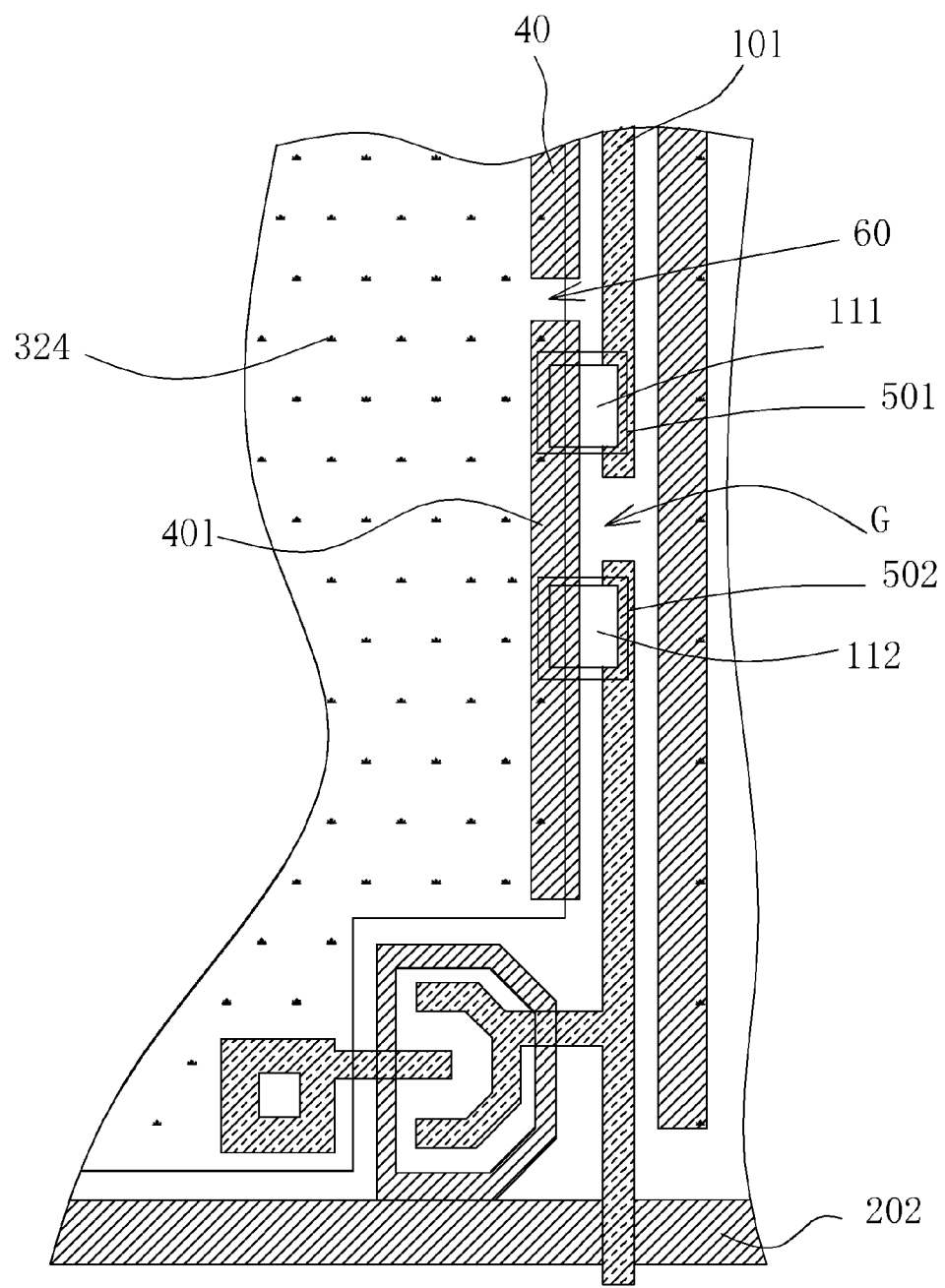
FIG. 7 is a sectional zoomed-in diagram of FIG. 5.

FIG. 7 is a sectional zoomed-in diagram of FIG. 5. Referring to FIG. 5 and FIG. 7, in the present embodiment, the common line 40 serving as the bottom electrode of the storage capacitor has a "C" shape, wherein the "C" shaped common line section 401 is the line section of the common line 40 after the cutting process and is not electrically connected to the original common line 40, i.e. the common line section 401 above the connecting metal layer 111 is cut off. The previously described cut off region is the opening 60, and the "C"

shaped common line section 401 is partially coupled with the pixel electrode 324 and partially contacts the connecting metal layers 111 and 112. The pixel electrode 324 on the overlapping region of the common line section 401 and the pixel electrode 324 electrically connected to the connecting metal layers 111 and 112 is removed, and the removed portion is slightly larger than the connecting metal layers 111 and 112, so that the first data line 101 and the pixel electrode 324 are not electrically connected. In addition, the connecting metal layers 111 and 112 are also partially overlapping the first data line 101 having the line defect G, wherein the connecting metal layers 111 and 112 are disposed adjacent to the two ends of the line defect G, but do not overlap the line defect G. Therefore, the repaired circuit described above allows the first data line 101 having the line defect G to complete the transmission via the common line section 401. However, when the shielding layer includes the insulation layer and the transparent electrode layer, method 1 is employed. When a higher energy laser light beam is used to remove the shielding layer, the laser chemical vapor deposition (L-CVD) repairing apparatus is used using a tungsten-carbon compound as its target material to deposit the connecting metal layer 111 and 112 on the regions where the first data line 101 and the common line section 401 are exposed, i.e. the connection holes 501 and 502, for repairing the line defect G of the first data line 101. Here, the connecting metal layers 111 and 112 are respectively smaller than the exposed regions of the first data line 101 and the common line section 401, i.e. the positions of the connection holes 501 and 502. Then the laser light beam is used to cut off the common line section 401 above the connecting metal layer 111 to form the opening 60. Meanwhile, the first data line 101 signal passes through the common line section 401 between the connecting metal layers 111 and 112 to complete the signal transmission.

Figure 8:
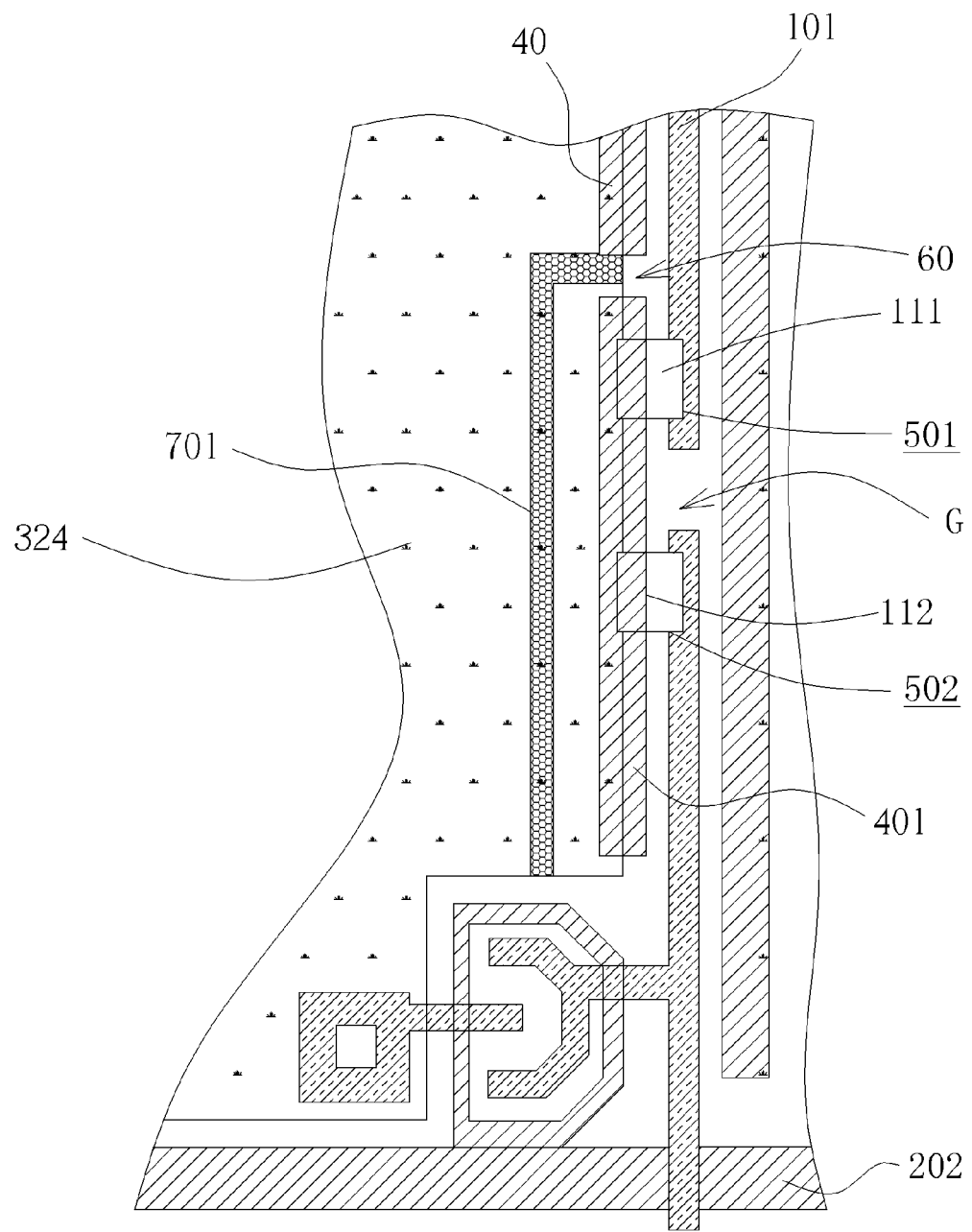
FIG. 8 is another sectional zoomed-in diagram of FIG. 5.

FIG. 8 is another sectional zoomed-in diagram of FIG. 5. Referring to FIG. 5 and FIG. 8, when the shielding layer includes the shielding layer for metal, the passivation layer and the pixel electrode, method 2 is employed. First the shielding layer for metal, the passivation layer and the pixel electrode are removed as mentioned above, to form the connection holes 501 and 502; then the laser chemical vapor deposition (L-CVD) repairing apparatus is used using a tungsten-carbon compound as its target material to deposit the connecting metal layer 111 and 112 on the regions where the first data line 101 and the common line section 401 are exposed, i.e. the connection holes 501 and 502, to repair the line defect G of the first data line 101. Typically, the connecting metal layers 111 and 112 are slightly larger than the exposed regions of the first data line 101 and the common line section 401, i.e. the connection holes 501 and 502, so that the connecting metal layers 111 and 112 cover a portion of the first data line 101 and a portion of the common line section 401. Then the laser light beam is used to disconnect the common line section 401 located above the connecting metal layer 111, to form the opening 60. Finally, a thin channel 701 is formed in the pixel electrode 324 around the common line section 401 by the laser light beam, so that the common line section 401 between the connecting metal layers 111 and 112 is not electrically connected to the pixel electrode 324. Meanwhile, the signal of the first data line 101 passes through the common line section 401 between the connecting metal layers 111 and 112 to complete the signal transmission.

The embodiments described above may also be used in a dual scan line structure of the array substrate of the liquid crystal display device, and the common line of the array substrate has a "C" shape, serving as the bottom electrode for the storage capacitor.

Figure 9:
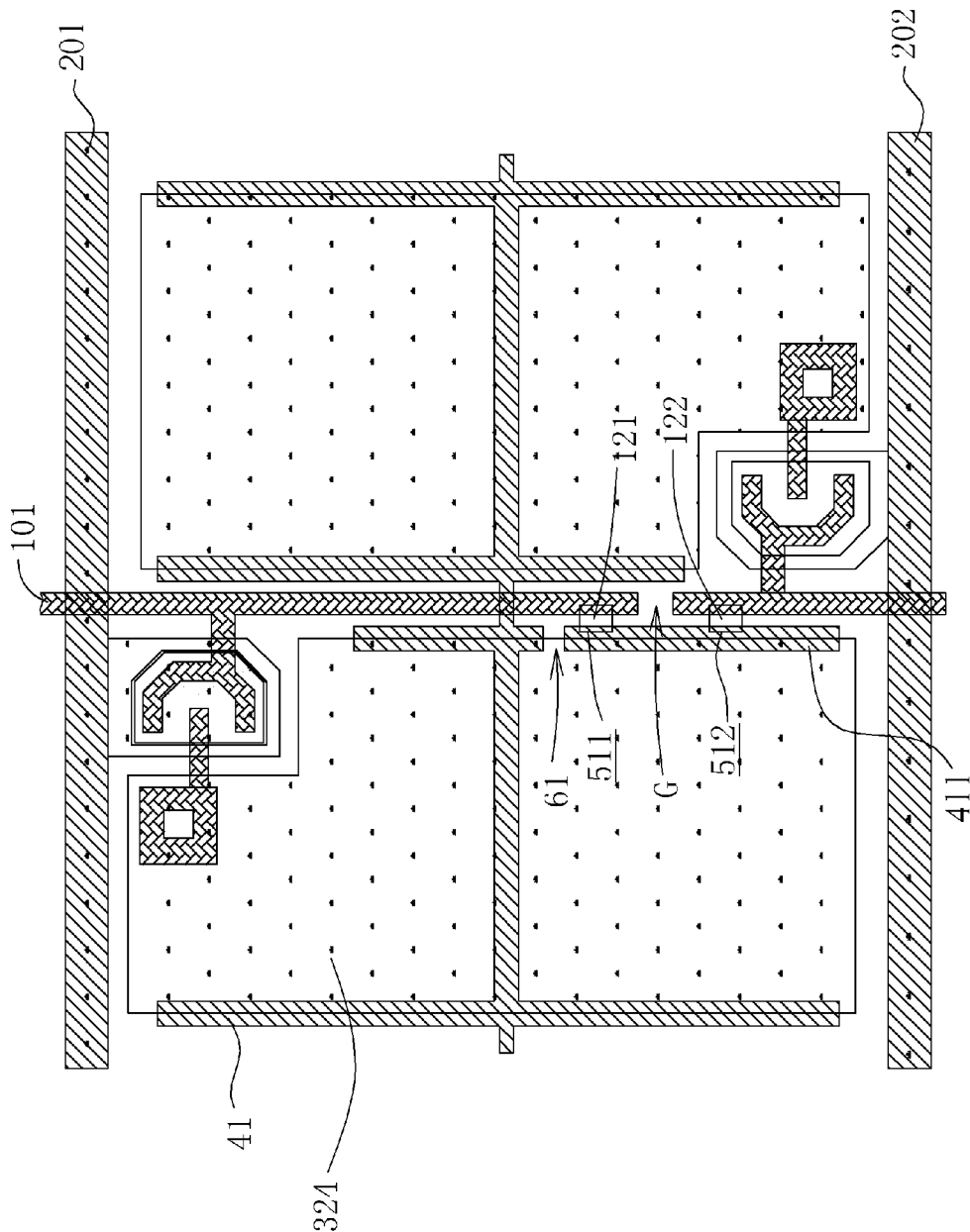
FIG. 9 is a schematic diagram illustrating a line defect in an "H" shaped common line in accordance with the present invention.

FIG. 9 is a schematic diagram illustrating a line defect in an "H" shaped common line in accordance with the present invention. In the present embodiment, the common line serving as the bottom electrode of the storage capacitor, has an "H" shape. A first data line 101 and a first scan line 201 are disposed perpendicularly, the first scan line 201 is disposed parallel to a second scan line 202, and the second scan line 202 is disposed perpendicular to the first data line 101. The intersected data lines and the scan lines define a plurality of pixel units, wherein a common line 41 serving as a bottom electrode of the storage capacitor is disposed on top of the data lines and the scan lines, and the common line 41 forms the storage capacitor with the pixel electrode 324 in the pixel unit. The shape of the common line 41 on the pixel unit affects the magnitude of the storage capacitor directly. In the present embodiment, the common line 41 serving as the bottom electrode of the storage capacitor has an "H" shape, wherein an "H" shaped common line section 411 is the line section of the common line 41 after the cutting process and is not electrically connected to the original common line 41, i.e. the common line section 411 above the connecting metal layer 121 is cut off. The previously described cut off region is an opening 61, and the "H" shaped common line section 411 is partially coupled with the pixel electrode 324 and partially contacts connecting metal layers 121 and 122. In addition, the connecting metal layers 121 and 122 are also partially connected with the first data line 101 having the line defect G. The connecting metal layers 121 and 122 are disposed adjacent to the two ends of the line defect G, but do not overlap with the line defect G. Therefore, the repaired circuit described above allows the first data line 101 having the line defect G to complete the transmission via the common line section 411.

When the shielding layer includes a shielding layer for metal, or a combination of a shielding layer for metal, a passivation and a pixel electrode, a higher energy laser light beam is used to remove the shielding layer for metal, the passivation layer and the pixel electrode. Then the laser chemical vapor deposition (L-CVD) repairing apparatus is used using a tungsten-carbon compound as its target material to deposit the connecting metal layers 121 and 122 on the regions where the first data line 101 and the common line section 411 are exposed, i.e. the connection holes 511 and 512, to repair the line defect G of the first data line 101. Typically, the thickness of the connecting metal layers 121 and 122 is between 2000 Å and 4000 Å, and here the connecting metal layers 121 and 122 are respectively larger than the exposed regions of the first data line 101 and the common line section 411, i.e. the connection holes 511 and 512. Then the laser light beam is used to cut off the common line section 411 above the connecting metal layer 121 to form the opening 61. Meanwhile, the signal of the first data line 101 passes through the common line section 411 between the connecting metal layers 121 and 122 to complete the signal transmission. The laser light beam mentioned above can be IR (far-infrared light), UV (far-ultraviolet light), Green light (Green), or laser light beam and is used for removing the shielding layer above. Typically, the wavelength of the IR is between 1000 nm and 1500 nm, the wavelength of the green light is between 450 nm and 600 nm, and through adjusting the energy of the light breams, the objective of removing the shielding layer can be achieved.

Figure 10:
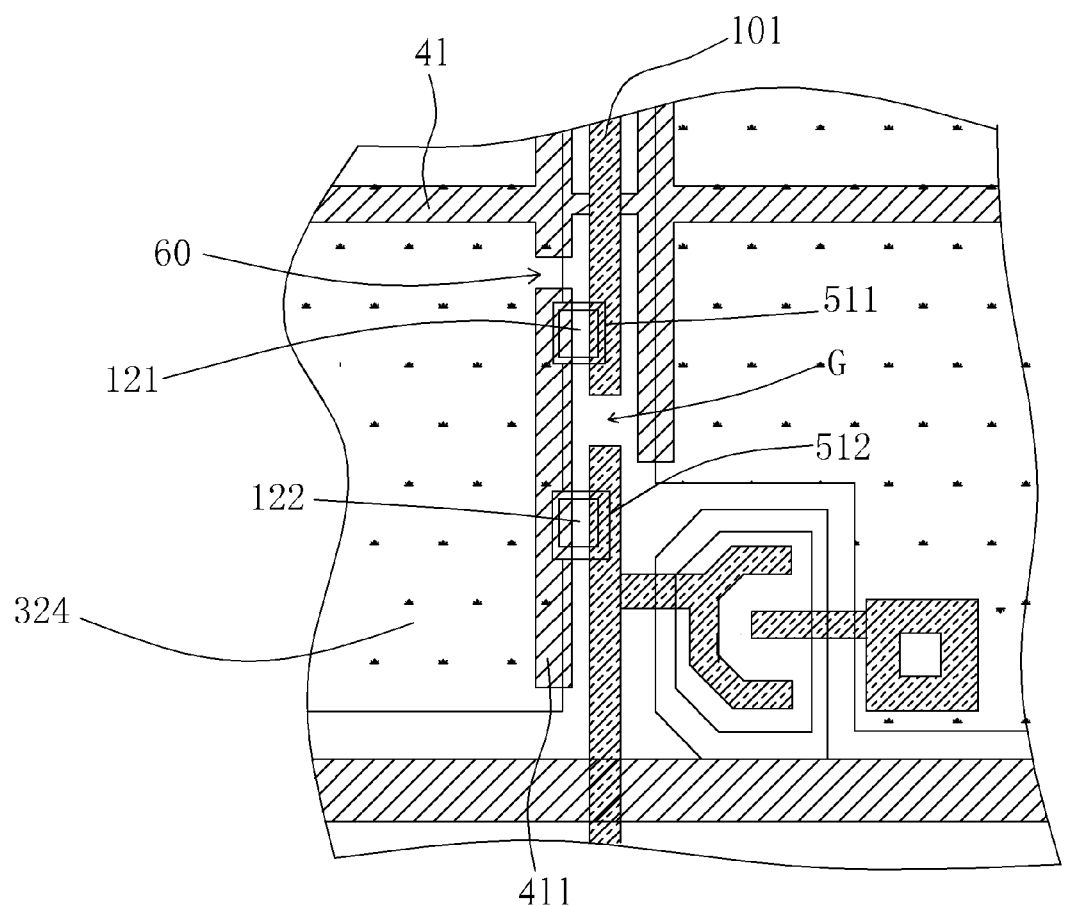
FIG. 10 is a schematic sectional zoomed-in diagram of FIG. 9.

When the shielding layer includes only the shielding layer for metal, the connecting metal layer is slightly larger than the exposed region of the data line and the common line, so that the electrical connection can be improved. When the shielding layer mentioned above includes the insulation layer and the transparent electrode layer, two different methods can be applied. In method 1, the connecting metal layer is slightly smaller than the exposed regions of the data line and common line, so that the transparent electrode layer is not electrically connected to the connecting metal layer, as illustrated in FIG. 10 where FIG. 10 is a schematic sectional zoomed-in diagram of FIG. 9. In the present embodiment, the common line 41 serving as the bottom electrode of the storage capacitor has an "H" shape, wherein an "H" shaped common line section 411 is the line section of the common line 41 after the cutting process and is not electrically connected to the original common line 41, i.e. the common line section 411 above the connecting metal layer 121 is cut off. The previously described cut off region is the opening 61, and the "H" shaped common line section 411 is partially coupled with the pixel electrode 324 and partially contacts the connecting metal layer 121 and 122. The pixel electrode 324 on the overlapping region of the common line section 411 and the connecting metal layers 121 and 122 is removed, and the removed portion is slightly larger than the connecting metal layers 121 and 122, so that the first data line 101 and the pixel electrode 324 are not electrically connected. In addition, the connecting metal layers 121 and 122 also partially overlap the first data line 101 having the line defect G, wherein the connecting metal layers 121 and 122 are disposed adjacent to the two ends of the line defect G, but do not overlap the line defect G. Therefore, the repaired circuit described above allows the first data line 101 having the line defect G to complete the transmission via the common line section 411. However, when the shielding layer includes the insulation layer and the transparent electrode layer, method 1 is employed. When a higher energy laser light beam is used to remove the shielding layer, the laser chemical vapor deposition (L-CVD) repairing apparatus is used using a tungsten-carbon compound as its target material to deposit the connecting metal layers 121 and 122 on the regions where the first data line 101 and the common line section 411 are exposed, i.e. the connection holes 511 and 512, for repairing the line defect G of the first data line 101. Here, the connecting metal layers 121 and 122 are respectively smaller than the exposed regions of the first data line 101 and the common line section 411, i.e. the positions of the connection holes 511 and 512. Then the laser light beam is used to cut off the common line section 411 above the connecting metal layer 121 to form the opening 60. Meanwhile, the signal of the first data line 101 passes through the common line section 411 between the connecting metal layers 121 and 122 to complete the signal transmission.

In method 2, in order to improve the electrical connection of the connecting metal layers, the connecting metal layers are slightly larger than the exposed regions of the data line and the common line. The step that disconnects the electrical connection between the connecting metal layers and the transparent electrode layer will be performed after all of the repair steps are completed. Specifically, a thin channel will be formed in the pixel electrode 324 around the common line after the common line disposed in the external ends of the shielding layer is cut off, so that the pixel electrode is not electrically connected to the common line between the connecting metal layers.

The embodiments described above may also be used in a dual scan line structure of the array substrate of the liquid crystal display device, and the common line of the array substrate has an "H" shape, serving as the bottom electrode for the storage capacitor.

Figure 11:
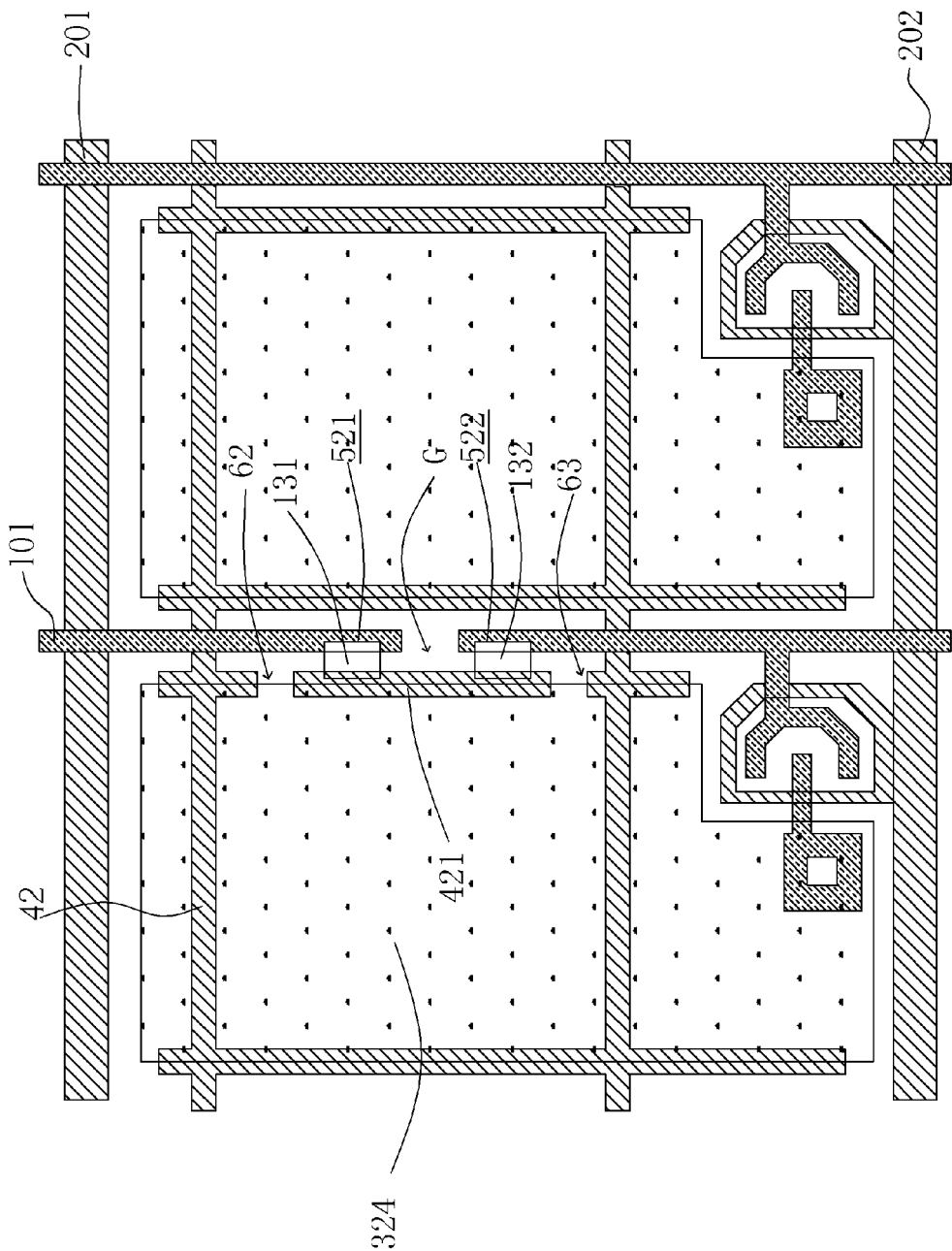
FIG. 11 is a schematic diagram illustrating a line defect in a hollow square shaped common line of the present invention.

FIG. 11 is a schematic diagram illustrating a line defect in a hollow square shaped common line of the present invention. In the present embodiment, the common line 42 serving as the bottom electrode of the storage capacitor has a hollow square shape. A first data line 101 is disposed perpendicular to a first scan line 201, the first scan line 201 is disposed parallel to a second scan line 202, and the second scan line 202 is disposed perpendicular to the first data line 101. The intersected data lines and the scan lines define a plurality of pixel units, wherein a common line 42 serving as a bottom electrode of the storage capacitor is disposed on top of the data lines and the scan lines, and the common line 42 forms the storage capacitor with the pixel electrode 324 in the pixel unit. The shape of the common line 42 on the pixel unit affects the magnitude of the storage capacitor directly.

In the present embodiment, the common line 42 serving as the bottom electrode of the storage capacitor has a hollow square shape, wherein the common line section 421 is the line section of the common line 42 after the cutting process and is not electrically connected to the original common line 42, i.e. the common line section 421 above the connecting metal layer 131 is cut. The previously described cut off region is the openings 62 and 63, and the common line section 421 is partially coupled with the pixel electrode 324 and partially contacts the connecting metal layers 131 and 132. In addition, the connecting metal layers 131 and 132 are also partially connected to the first data line 101 having the line defect G. The connecting metal layers 131 and 132 are disposed adjacent to the two ends of the line defect G, but do not overlap the line defect G. Therefore, the repaired circuit described above allows the first data line 101 having the line defect G to complete the transmission via the common line section 421.

When the shielding layer includes a shielding layer for metal, or a combination of a shielding layer for metal, a passivation and a pixel electrode, a higher energy laser light beam is used to remove the shielding layer for metal, the passivation layer and the pixel electrode. Then the laser chemical vapor deposition (L-CVD) repairing apparatus is used using a tungsten-carbon compound as its target material to deposit the connecting metal layers 131 and 132 on the regions where the first data line 101 and the common line section 421 are exposed, i.e. the connection holes 521 and 522, to repair the line defect G of the first data line 101. Typically, the thickness of the connecting metal layers 131 and 132 is between 2000 Å and 4000 Å, and here the connecting metal layers 131 and 132 are respectively larger than the exposed regions of the first data line 101 and the common line section 421, i.e. the connection holes 521 and 522. Then the laser light beam is used to cut off the common line section 421 above the connecting metal layers 131 and 132 to form the openings 62 and 63. Meanwhile, the signal of the first data line 101 passes through the common line section 421 between the connecting metal layers 131 and 132 to complete the signal transmission. The laser light beam mentioned above can be IR (far-infrared light), UV (far-ultraviolet light), Green light (Green), or laser light beam and is used for removing the shielding layer above. Typically, the wavelength of the IR is between 1000 nm and 1500 nm, the wavelength of the green light is between 450 nm and 600 nm, and through adjusting the energy of the light bream, the objective of removing the shielding layer can be achieved.

When the shielding layer includes only the shielding layer for metal, the connecting metal layer is slightly larger than the exposed regions of the data line and the common line, so that the electrical connection can be improved. When the shielding layer mentioned above includes the insulation layer and the transparent electrode layer, two different methods can be applied. In method 1, the connecting metal layer is slightly smaller than the exposed regions of the data line and common line exposed, so that the transparent electrode layer is not electrically connected to the connecting metal layer. In method 2, in order to improve the electrical connection of the connecting metal layer, the connecting metal layer is slightly larger than the exposed regions of the data line and the common line. The step that disconnects the electrical connection between the connecting metal layer and the transparent electrode layer will be performed after all of the repair steps are completed. Specifically, a thin channel will be formed in the pixel electrode 324 around the common line after the common line disposed in the external ends of the shielding layer is cut off, so that the pixel electrode is not electrically connected to the common line between the connection metal layers.

The embodiments described above may also be used in a dual scan line structure of the array substrate of the liquid crystal display device, and the common line of the array substrate has a hollow square shape, serving as the bottom electrode for the storage capacitor.

Figure 12:
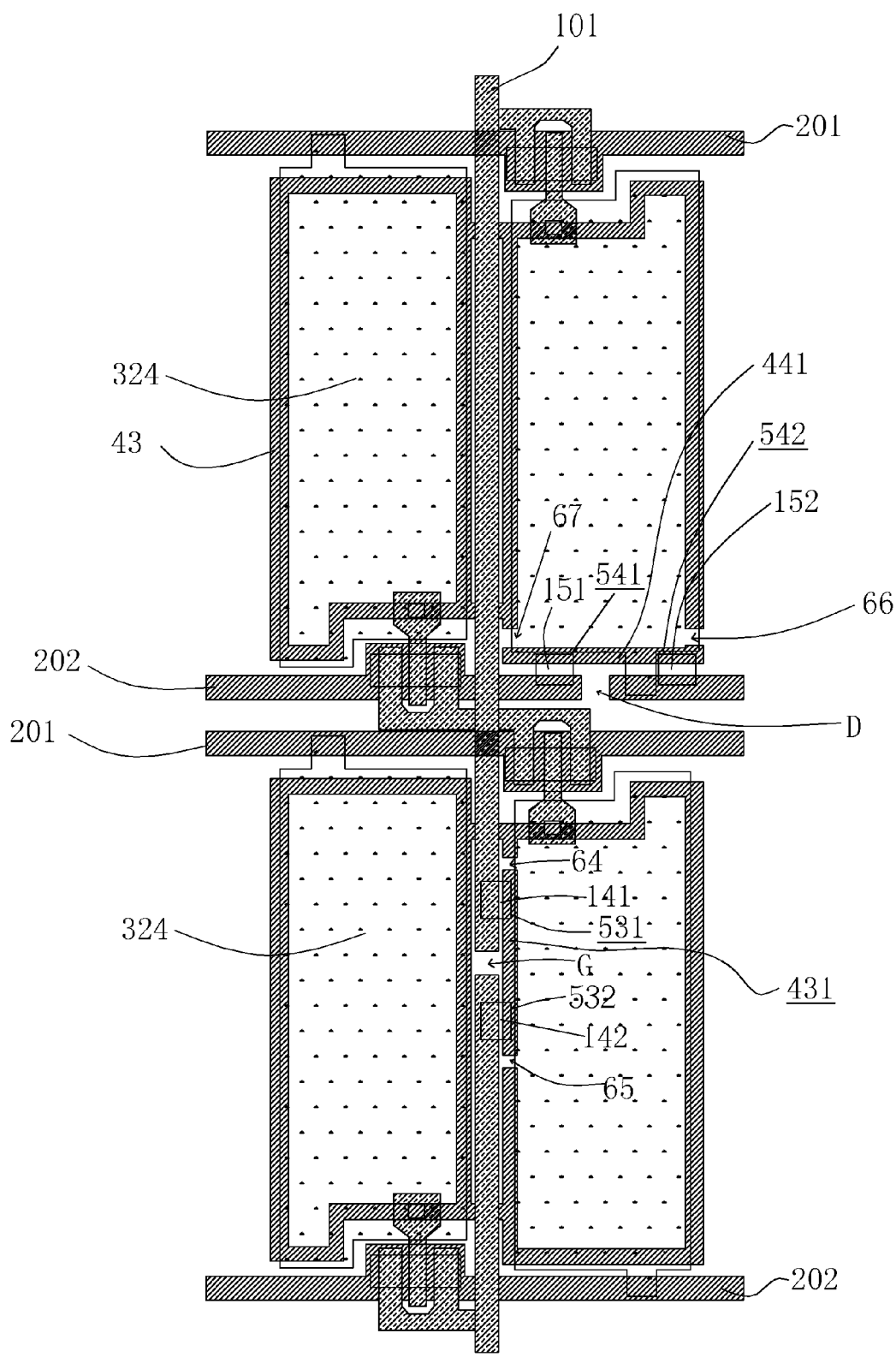
FIG. 12 is a schematic diagram illustrating a line defect in another hollow square shaped common line of the present invention.

FIG. 12 is a schematic diagram illustrating a line defect in another hollow square shaped common line of the present invention. Referring to bottom portion of FIG. 12, in the present embodiment, the common line serving as the bottom electrode of the storage capacitor has a hollow square shape. A first data line 101 is disposed perpendicular to a first scan line 201, the first scan line 201 is disposed parallel to a second scan line 202, and the second scan line 202 is disposed perpendicular to the first data line 101. The intersected data lines and the scan lines define a plurality of pixel units, wherein a common line 43 serving as a bottom electrode of the storage capacitor is disposed on top of the data lines and the scan lines, and the common line 43 forms the storage capacitor with a pixel electrode 324 in the pixel unit. The shape of the common line 43 on the pixel unit affects the magnitude of the storage capacitor directly. In the present embodiment, the common line 43 serving as the bottom electrode of the storage capacitor has the hollow square shape, wherein the common line section 431 is the line section of the common line 43 after the cutting process and is not electrically connected to the original common line 43, i.e. the common line section 431 above the connecting metal layers 141 and 142 is cut. The previously described cut off region is the openings 64 and 65, and the common line section 431 is partially coupled with the pixel electrode 324 and partially contacts the connecting metal layers 141 and 142. In addition, the connecting metal layers 141 and 142 are also partially connected with the first data line 101 having the line defect G. The connecting metal layers 141 and 142 are disposed adjacent to the two ends of the line defect G, but do not overlap the line defect G. Therefore, the repaired circuit described above allows the first data line 101 having the line defect G to complete the transmission via the common line section 431.

Figure 13:
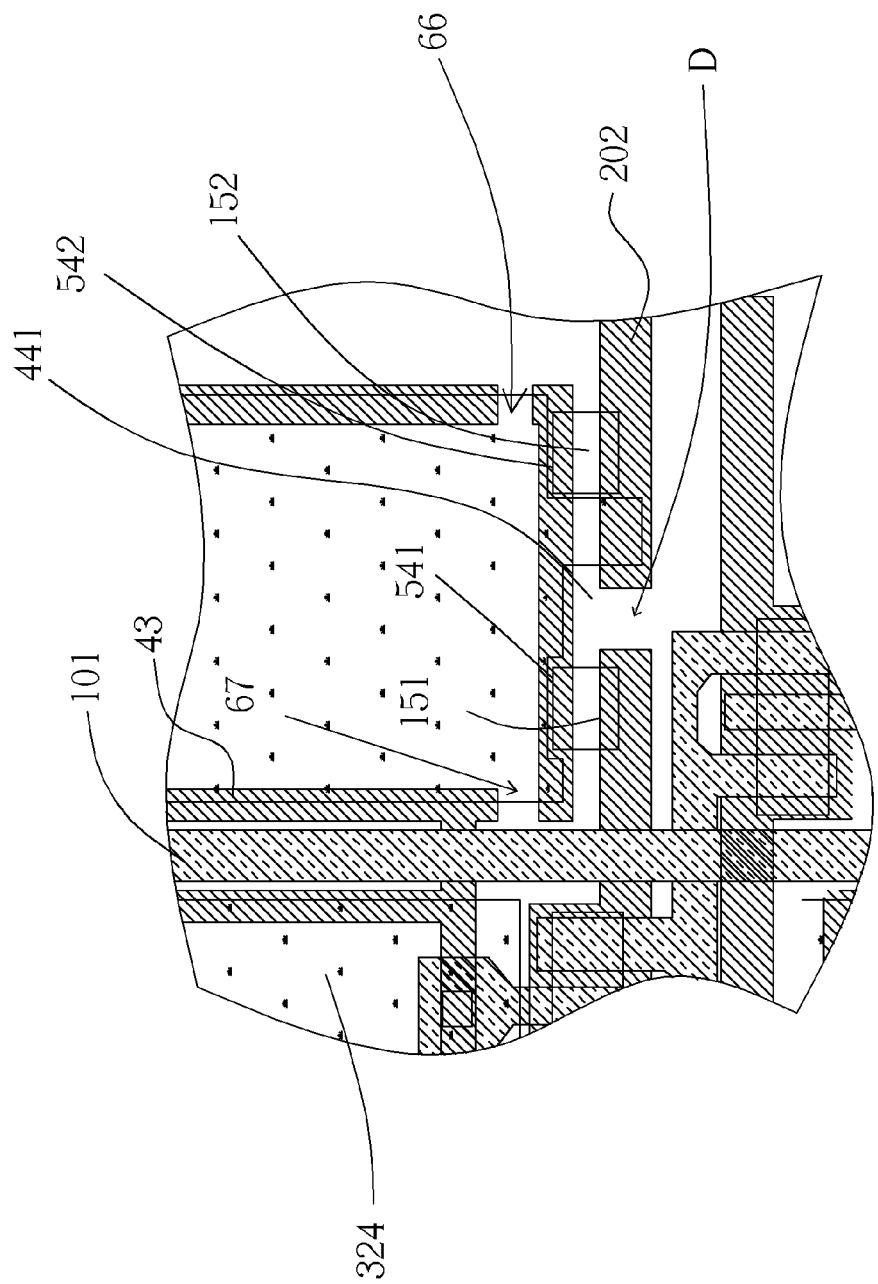
FIG. 13 is a sectional zoomed-in diagram of FIG. 12.

Referring to upper portion of FIG. 12 and FIG. 13, the common line 43 serving as the bottom electrode of the storage capacitor has the hollow square shape, wherein the common line section 441 is the line section of the common line 43 after the cutting process and is not electrically connected to the original common line 43, i.e. the common line section 441 above the connecting metal layers 151 and 152 is cut. The previously described cut off region is the openings 66 and 67, and the common line section 441 is partially coupled with the pixel electrode 324 and partially contacts the connecting metal layer 151 and 152. In addition, the connecting metal layer 151 and 152 also partially connect with the second scan line 202 having a line defect D. The connecting metal layers 151 and 152 are disposed adjacent to the two ends of the line defect D, but do not overlap the line defect D. Therefore, the repaired circuit described above allows the second scan line 202 having the line defect D to complete the transmission via the common line section 441.

When the shielding layer includes a shielding layer for metal, or a combination of a shielding layer for metal, a passivation and a pixel electrode, a higher energy laser light beam is used to remove the shielding layer for metal, the passivation layer and the pixel electrode. Then the laser chemical vapor deposition (L-CVD) repairing apparatus is used using a tungsten-carbon compound as its target material to deposit the connecting metal layer on the regions where the first data line 101 or the second scan line 202, and the common line section are exposed, i.e. the connection holes, to repair the line defect D of the first data line 101 or the second scan line 202. Typically, the thickness of the connecting metal layers 151 and 152 is between 2000 Å to 4000 Å, and here the connecting metal layers 151 and 152 are respectively larger than the exposed region of the first data line 101 and the common line section 441, i.e. the connection holes. Then the laser light beam is used to cut off the common line section 441 above the connecting metal layers 151 and 152 to form the openings 66 and 67. Meanwhile, the signal of the first data line 101 or the signal of the second scan line 202 passes through the common line section 441 between the connecting metal layers 151 and 152 to complete the signal transmission. The laser light beam mentioned above can be IR (far-infrared light), UV (far-ultraviolet light), Green light (Green), or laser light beam and is used for removing the shielding layer above. Typically the wavelength of the IR is between 1000 nm and 1500 nm, the wavelength of the green light is between 450 nm and 600 nm, and through adjusting the energy of the light bream, the objective of removing the shielding layer can be achieved.

When the shielding layer mentioned above includes the shielding layer for metal, the passivation layer and the pixel electrode, the connecting metal layer is designed to have a dimension equal to the exposed regions of the data line and the common line, but a portion of the pixel electrode is removed so that the transparent electrode layer is not electrically connected to the connecting metal layer, as illustrated in FIG. 13. In the present embodiment, the common line 43 serving as the bottom electrode of the storage capacitor has a square shape, wherein the hollow square shaped common line section 441 is the line section of the common line 43 after the cutting process and is not electrically connected to the original common line 43, i.e. the common line section 441 above the connecting metal layers 151 and 152 is cut. The previously described cut off region is the openings 66 and 67, and the common line section 441 is partially coupled with the pixel electrode 324 and partially contacts the connecting metal layers 151 and 152. The pixel electrode 324 on the overlapping region of the common line section 441 and the connecting metal layers 151 and 152 is removed, and the removed portion is slightly larger than the connecting metal layers 151 and 152, so that the second scan line 202 and the pixel electrode 324 are not electrically connected. In addition, the connecting metal layers 151 and 152 are also partially connected with the second scan line 202 having the line defect D, wherein the connecting metal layers 151 and 152 are disposed adjacent to the two ends of the line defect D, but do not overlap the line defect D. Therefore, the repaired circuit described above allows the second data 202 having the line defect D to complete the transmission via the common line section 441. In addition, when the shielding layer includes the insulation layer and the transparent electrode layer, the method described above is employed. A higher energy laser light beam is used to remove the shielding layer, and the laser chemical vapor deposition (L-CVD) repairing apparatus is used using a tungsten-carbon compound as its target material to deposit the connecting metal layers 151 and 152 on the exposed regions of the second scan line 202 and the common line section 441, i.e. the connection holes 541 and 542, to repair the line defect D of the second scan line 202. Here, the connecting metal layers 151 and 152 are designed to have a dimension equal to the exposed regions of the data line and the common line section 441, i.e. the dimension of the connection holes 521 and 522. Then the laser light beam is used to cut off the common line section 441 above the connecting metal layers 151 and 152 to form the openings 66 and 67. Meanwhile, the signal of the second scan line 202 passes through the common line section 441 between the connecting metal layers 151 and 152 to complete the signal transmission.

Figure 14:
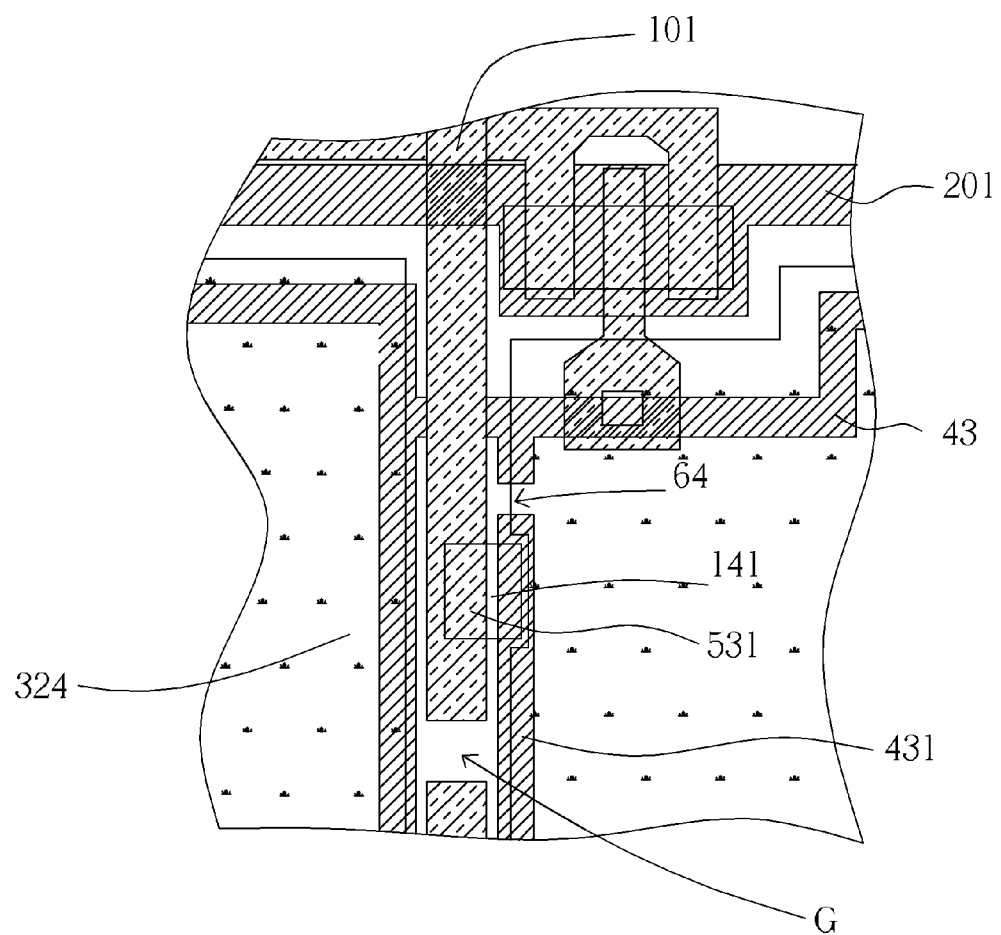
FIG. 14 is another sectional zoomed-in diagram of FIG. 12.

When the shielding layer mentioned above includes the shielding layer for metal, the passivation layer and the pixel electrode, the connecting metal layers are designed to have a dimension equal to the exposed regions of the data line and the common line, but a portion of the pixel electrode is removed so that the transparent electrode layer is not electrically connected to the connecting metal layers, as illustrated in FIG. 14 where FIG. 14 is another schematic sectional zoomed-in diagram of FIG. 12. Referring to FIG. 12 and FIG. 14, in the present embodiment, the common line 43 serving as the bottom electrode of the storage capacitor has a square shape, wherein the common line section 431 is the line section of the common line 43 after the cutting process and is not electrically connected to the original common line 43, i.e. the common line section 431 above the connecting metal layer 142 is cut. The previously described cut off region is the opening 65, and the common line section 431 is partially coupled with the pixel electrode 324 and partially contacts the connecting metal layer 142. The pixel electrode 324 on the overlapping region of the common line section 431 and the connecting metal layer 142 is removed, and the removed portion is slightly larger than the connecting metal layer 142, so that the first data line 101 and the pixel electrode 324 are not electrically connected. In addition, the connecting metal layer 142 is also partially connected with the first data line 101 having the line defect G, wherein the connecting metal layer 142 is disposed adjacent to one end of the line defect G, but do not overlap the line defect G. Therefore, the repaired circuit described above allows the first data line 101 having the line defect G to complete the transmission via the common line section 431. However, when the shielding layer includes the insulation layer and the transparent electrode layer, the method described above is employed. A higher energy laser light beam is used to remove the shielding layer, and the laser chemical vapor deposition (L-CVD) repairing apparatus is used using a tungsten-carbon compound as its target material to deposit the connecting metal layer 142 on the exposed regions of the first data line 101 and the common line section 431, i.e. the connection hole 532, to repair the line defect G of the first data line 101. Here, the connecting metal layer 142 is designed to have a dimension equal to the exposed regions of the first data line 101 and the common line section 431, i.e. the dimension of the connection hole 532. Then the laser light beam is used to cut off the common line section 431 above the connecting metal layer 142 to form the opening 65. Meanwhile, the signal of the first data line 101 passes through the common line section 431 between the connecting metal layers 141 and 142 to complete the signal transmission.

Those skilled in the art will readily observe that numerous modifications and alterations of the device and method may be made while retaining the teachings of the invention.

What is claimed is:

1. A repair method for an array substrate of a liquid crystal display device, comprising the steps of:
providing an array substrate of a liquid crystal display device;
detecting a line defect of a signal transmitting wire and locating the line defect;
disconnecting a shielding layer extending to a common line adjacent to the line defect;
performing a deposition process to deposit a connecting metal layer adjacent to the shielding layer and covering two ends of the line defect; and
performing a cutting process to cut outer ends of the common line adjacent to the line defect to form a common line section, wherein the signal transmitting wire forms an electrical circuit with the common line section through the connecting metal layer.

2. The repair method for the array substrate of the liquid crystal display device of claim 1, wherein the signal transmitting wires on the array substrate of the liquid crystal display device comprise a scan line and a data line.

3. The repair method for the array substrate of the liquid crystal display device of claim 2, wherein the common line and the scan line are formed by a same layer.

4. The repair method for the array substrate of the liquid crystal display device of claim 2, wherein the common line has a hollow square shape, and the hollow square shape common line is capable of repairing either the data line or the scan line simultaneously.

5. The repair method for the array substrate of the liquid crystal display device of claim 1, wherein the common line section on the array substrate of the liquid crystal display device is a segment cut from the common line after the cutting process and the common line section is electrically disconnected from the common line.

6. The repair method for the array substrate of the liquid crystal display device of claim 1, wherein the shielding layer is an insulation layer.

7. The repair method for the array substrate of the liquid crystal display device of claim 1, wherein the shielding layer includes an insulation layer, a pixel electrode layer and a passivation layer.

8. The repair method for the array substrate of the liquid crystal display device of claim 7, wherein the insulation layer, the passivation layer and the pixel electrode layer are disconnected by a same process.

9. The repair method for the array substrate of the liquid crystal display device of claim 1, wherein the the shielding layer is disconnected by one of far-infrared light, far-ultraviolet light, green light and laser light beam.

10. The repair method for the array substrate of the liquid crystal display device of claim 1, wherein the connecting metal layer includes a tungsten layer.

11. The repair method for the array substrate of the liquid crystal display device of claim 1, wherein a target material used for the deposition process for depositing the connecting metal layer includes a tungsten-carbon compound.

12. The repair method for the array substrate of the liquid crystal display device of claim 1, wherein a thickness of the connecting metal layer formed by the deposition process is substantially between 2000 angstroms (Å) and 4000 Å.

13. An array substrate of a liquid crystal display device repaired by the repair method of claim 1, comprising:
a plurality of signal transmitting wires, wherein the signal transmitting wires are intersected perpendicularly to form a plurality of pixel units, and the signal transmitting wires include at least a line defect;

a plurality of thin film transistors disposed in the pixel units, the thin film transistors being driven by the signal transmitting wires;
a plurality of common lines disposed on the array substrate;
at least one common line section, wherein the common line section is parallel to the signal transmitting wires, and the common line section is electrically connected to one of the signal transmitting wires;
a connecting metal layer disposed on two ends of the line defect and electrically connected to one of the signal transmitting wires and the common line section; and
a plurality of pixel electrodes disposed in the pixel units one-to-one and electrically connected to the thin film transistors respectively, wherein a portion of each of the pixel electrode is coupled with the corresponding common line to form a storage capacitor.

14. The array substrate of the liquid crystal display device of claim 13, wherein at least one of the pixel electrodes includes at least one opening corresponding to the line defect, and the connecting metal layer disposed in the opening is electrically insulated from one of the pixel electrodes.

* * * * *